United States Patent
Halbritter et al.

(10) Patent No.: US 10,153,414 B2
(45) Date of Patent: Dec. 11, 2018

(54) OPTOELECTRONIC COMPONENT

(71) Applicant: OSRAM Opto Semiconductors GmbH, Regensburg (DE)

(72) Inventors: Hubert Halbritter, Dietfurt-Toeging (DE); Britta Goeoetz, Regensburg (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/559,946

(22) PCT Filed: Mar. 18, 2016

(86) PCT No.: PCT/EP2016/055940
§ 371 (c)(1),
(2) Date: Sep. 20, 2017

(87) PCT Pub. No.: WO2016/150842
PCT Pub. Date: Sep. 29, 2016

(65) Prior Publication Data
US 2018/0076366 A1    Mar. 15, 2018

(30) Foreign Application Priority Data
Mar. 20, 2015  (DE) .................. 10 2015 104 237

(51) Int. Cl.
| H01L 33/60 | (2010.01) |
| H01L 33/46 | (2010.01) |
| H01L 33/50 | (2010.01) |
| H01L 33/48 | (2010.01) |
| H01L 33/54 | (2010.01) |

(52) U.S. Cl.
CPC .............. *H01L 33/60* (2013.01); *H01L 33/46* (2013.01); *H01L 33/483* (2013.01); *H01L 33/50* (2013.01); *H01L 33/507* (2013.01); *H01L 33/54* (2013.01)

(58) Field of Classification Search
CPC ....... H01L 33/60; H01L 33/54; H01L 33/507; H01L 33/483; H01L 33/46; H01L 33/50
See application file for complete search history.

(56) References Cited

U.S. PATENT DOCUMENTS

| 2007/0126017 A1 | 6/2007 | Krames et al. |
| 2009/0236619 A1 | 9/2009 | Chakroborty |
| 2009/0261366 A1* | 10/2009 | Eisert ...................... H01L 33/46 |
| | | 257/98 |

(Continued)

FOREIGN PATENT DOCUMENTS

| DE | 10 2004 002 101 A1 | 5/2005 |
| DE | 10 2008 017 071 A1 | 8/2009 |

(Continued)

*Primary Examiner* — Kyoung Lee
(74) *Attorney, Agent, or Firm* — DLA Piper LLP (US)

(57) ABSTRACT

An optoelectronic component includes an optoelectronic semiconductor chip configured to emit electromagnetic radiation including a wavelength from a first spectral range, a wavelength-converting element configured to convert electromagnetic radiation including a wavelength from the first spectral range into electromagnetic radiation including a wavelength from a second spectral range, and a reflective element including a first reflectivity in the first spectral range and a second reflectivity in the second spectral range, wherein the first spectral range is below 1100 nm, and the second spectral range is above 1200 nm.

11 Claims, 3 Drawing Sheets

(56) References Cited

U.S. PATENT DOCUMENTS

| | | |
|---|---|---|
| 2010/0320480 A1 | 12/2010 | Rapoport et al. |
| 2013/0087821 A1 | 4/2013 | Do et al. |
| 2014/0264412 A1 | 9/2014 | Yoon et al. |
| 2017/0125646 A1 | 5/2017 | Halbritter et al. |

FOREIGN PATENT DOCUMENTS

| | | |
|---|---|---|
| DE | 11 2011 102 506 T5 | 1/2014 |
| DE | 10 2014 107 960 A1 | 12/2015 |
| DE | 11 2015 002 642 A5 | 2/2017 |
| EP | 0 922 305 A2 | 6/1999 |
| EP | 0 922 305 B1 | 6/1999 |
| EP | 2 357 677 A1 | 8/2011 |

\* cited by examiner

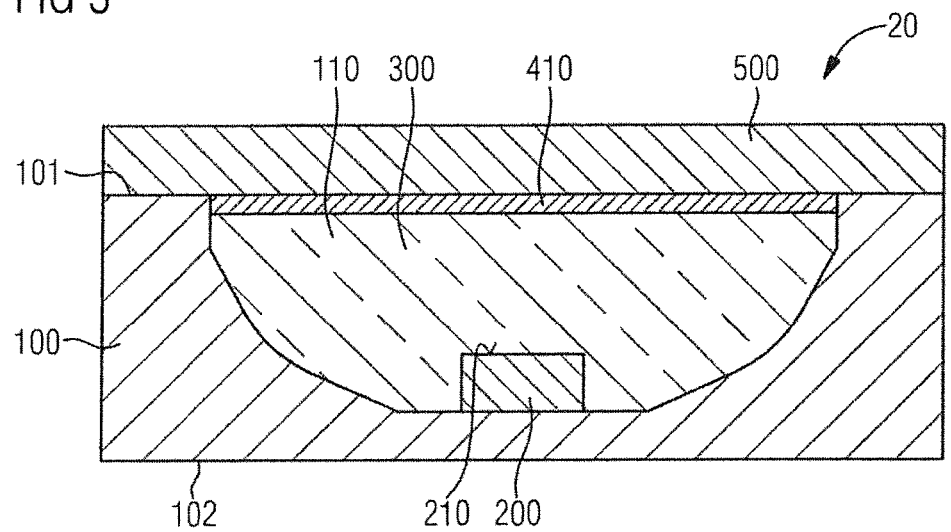
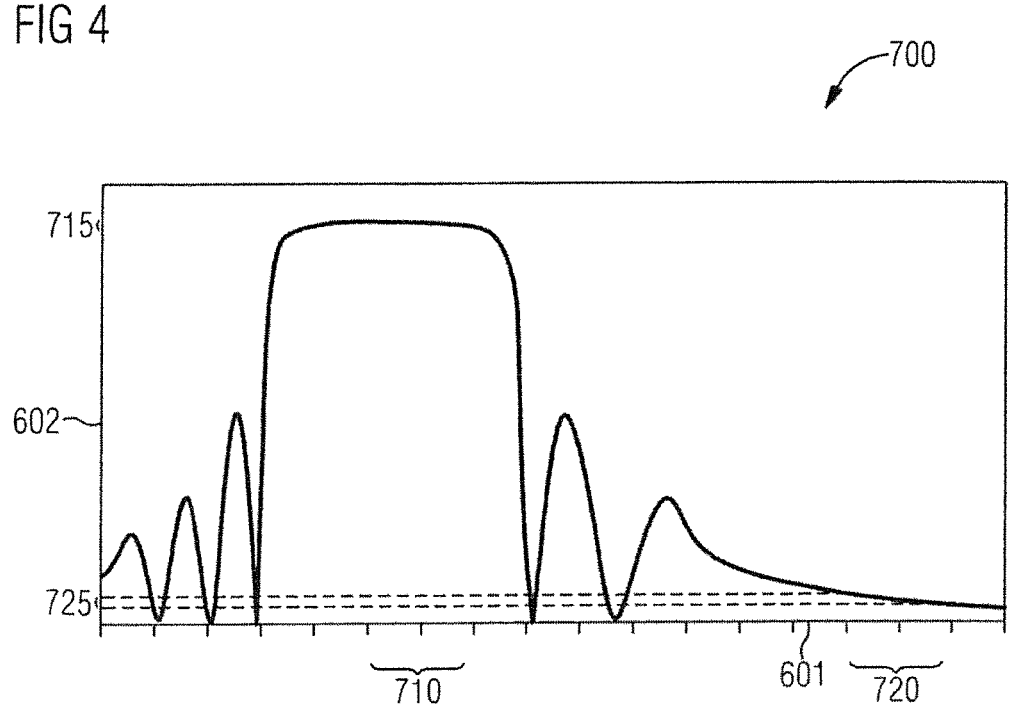

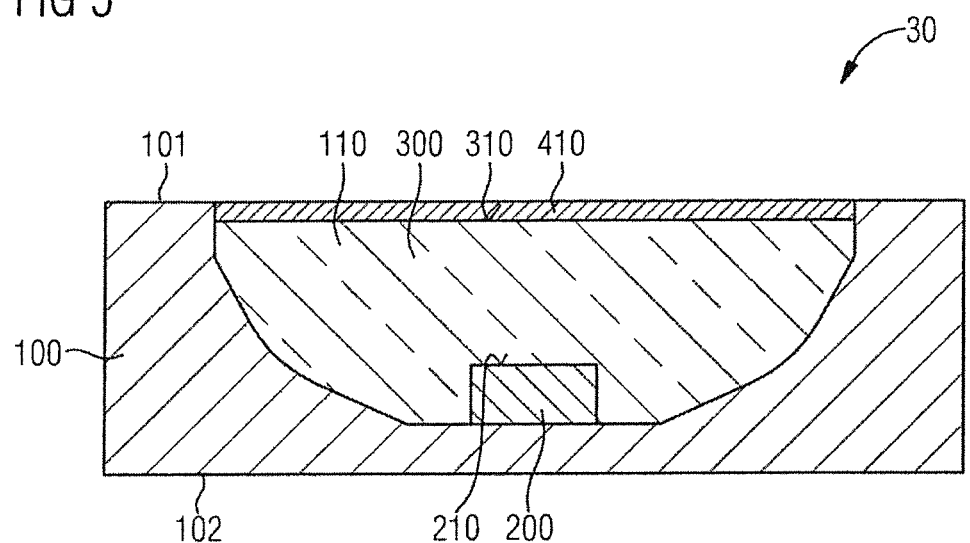
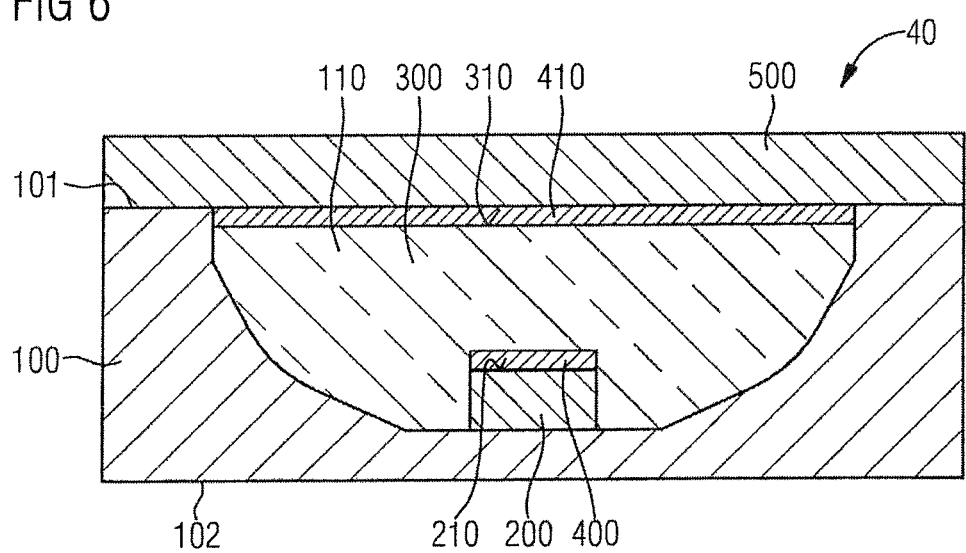

OPTOELECTRONIC COMPONENT

TECHNICAL FIELD

This disclosure relates to an optoelectronic component.

BACKGROUND

Optoelectronic components are known in which electromagnetic radiation emitted by an optoelectronic semiconductor chip and comprising a wavelength from a first spectral range is converted by a wavelength-converting element at least partly into electromagnetic radiation comprising a wavelength from a second spectral range.

SUMMARY

We provide an optoelectronic component including an optoelectronic semiconductor chip configured to emit electromagnetic radiation including a wavelength from a first spectral range, a wavelength-converting element configured to convert electromagnetic radiation including a wavelength from the first spectral range into electromagnetic radiation including a wavelength from a second spectral range, and a reflective element including a first reflectivity in the first spectral range and a second reflectivity in the second spectral range, wherein the first spectral range is below 1100 nm, and the second spectral range is above 1200 nm.

BRIEF DESCRIPTION OF THE DRAWINGS

FIG. 3 shows a schematic sectional side view of a second optoelectronic component.

FIG. 4 shows a second schematic reflectivity diagram.

FIG. 5 shows a schematic sectional side view of a third optoelectronic component.

FIG. 6 shows a schematic sectional side view of a fourth optoelectronic component.

LIST OF REFERENCE SIGNS

Figure 1:
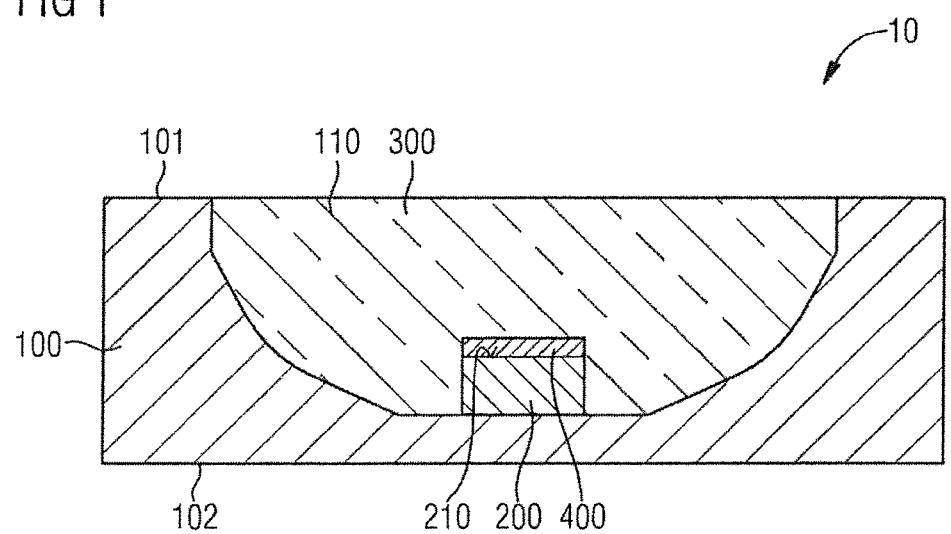
FIG. 1 shows a schematic sectional side view of a first optoelectronic component.

10 First optoelectronic component
20 Second optoelectronic component
30 Third optoelectronic component
40 Fourth optoelectronic component
100 Housing
101 Top side
102 Underside
110 Cavity
200 Optoelectronic semiconductor chip
210 Radiation emission face
300 Wavelength-converting element
310 Top side
400 First reflective element
410 Second reflective element
500 Carrier plate
600 First reflectivity diagram
601 Wavelength
602 Reflectivity
610 First spectral range
615 First reflectivity
620 Second spectral range
625 Second reflectivity
700 Second reflectivity diagram
710 First spectral range
715 First reflectivity
720 Second spectral range
725 Second reflectivity

DETAILED DESCRIPTION

Our optoelectronic component comprises an optoelectronic semiconductor chip configured to emit electromagnetic radiation comprising a wavelength from a first spectral range, a wavelength-converting element configured to convert electromagnetic radiation comprising a wavelength from the first spectral range into electromagnetic radiation comprising a wavelength from a second spectral range, and a reflective element comprising a first reflectivity in the first spectral range and a second reflectivity in the second spectral range.

The reflective element of the optoelectronic component may advantageously have the effect that, in electromagnetic radiation emitted by the optoelectronic component, the ratio of electromagnetic radiation comprising a wavelength from the second spectral range to electromagnetic radiation comprising a wavelength from the first spectral range is increased compared to an optoelectronic component without the reflective element.

The reflective element may be arranged between the optoelectronic semiconductor chip and the wavelength-converting element. In this case, the first reflectivity is less than the second reflectivity. This means that electromagnetic radiation comprising a wavelength from the second spectral range is reflected at the reflective element of the optoelectronic component to a greater extent than electromagnetic radiation comprising a wavelength from the first spectral range. What is advantageously achieved as a result is that electromagnetic radiation emitted by the optoelectronic semiconductor chip and comprising a wavelength from the first spectral range may penetrate through the reflective element substantially without being impeded, while electromagnetic radiation converted by the wavelength-converting element of the optoelectronic component and comprising a wavelength from the second spectral range is reflected by the reflective element. What may be achieved as a result is that electromagnetic radiation converted by the wavelength-converting element and backscattered in the direction of the optoelectronic semiconductor chip is not absorbed by the optoelectronic semiconductor chip, but rather is reflected by the reflective element, thereby enabling emission of the electromagnetic radiation by the optoelectronic component. As a result, absorption losses occurring in the optoelectronic component are reduced, as a result of which the efficiency of the optoelectronic component increases.

The reflective element may be arranged on a radiation emission face of the optoelectronic semiconductor chip. In this case, the reflective element may be applied, for example, on the radiation emission face of the optoelectronic semiconductor chip. However, the reflective element may also be integrated into the optoelectronic semiconductor chip at the radiation emission face of the optoelectronic semiconductor chip. The arrangement of the reflective element on the radiation emission face of the optoelectronic semiconductor chip advantageously achieves a particularly effective reflection of electromagnetic radiation comprising a wavelength from the second spectral range backscattered in the direction of the radiation emission face.

The wavelength-converting element may be arranged between the optoelectronic semiconductor chip and the reflective element. In this case, the first reflectivity is greater than the second reflectivity. This means that electromagnetic radiation comprising a wavelength from the first spectral range is substantially reflected by the reflective element, while electromagnetic radiation comprising a wavelength from the second spectral range may substantially penetrate through the reflective element. What may be achieved as a result is that electromagnetic radiation comprising a wavelength from the first spectral range, which electromagnetic radiation would not be converted by the wavelength-converting element, is reflected by the reflective element to the wavelength-converting element, where it obtains a further possibility of being converted. In contrast, electromagnetic radiation comprising a wavelength from the second spectral range already having been converted by the wavelength-converting element may penetrate through the reflective element and thereby be emitted by the optoelectronic component. As a result, the proportion of the electromagnetic radiation emitted by the optoelectronic component and comprising a wavelength from the second spectral range increases compared to the proportion of the electromagnetic radiation comprising a wavelength from the first spectral range.

The reflective element may be arranged on a carrier plate. The arrangement of the reflective element on a carrier plate advantageously enables simple and cost-effective production of the reflective element and of the optoelectronic component. The carrier plate may simultaneously perform further protection and covering functions in the optoelectronic component.

The carrier plate may comprise silicon. The carrier plate may be configured, for example, as part of a silicon wafer. Advantageously, in addition to its function as a carrier of the reflective element, the carrier plate may thereby bring about absorption of electromagnetic radiation comprising a wavelength from the first spectral range, as a result of which the proportion of the electromagnetic radiation comprising a wavelength from the second spectral range increases compared to the proportion of electromagnetic radiation comprising a wavelength from the first spectral range in the electromagnetic radiation emitted by the optoelectronic component.

The reflective element may be applied on a top side of the wavelength-converting element. Advantageously, the optoelectronic component is thereby configured particularly simply and with a small number of individual component parts. This makes it possible to configure the optoelectronic component with compact external dimensions and allows simple and cost-effective production of the optoelectronic component.

The optoelectronic component may comprise a further reflective element. In this case, the further reflective element is arranged between the optoelectronic semiconductor chip and the wavelength-converting element. The further reflective element comprises a lower reflectivity in the first spectral range than in the second spectral range. Advantageously, the optoelectronic component thereby combines the advantages of a reflective element arranged between the optoelectronic semiconductor chip and the wavelength-converting element with the advantages afforded when the wavelength-converting element is arranged between the optoelectronic semiconductor chip and a reflective element.

The reflective element may be configured as a Bragg mirror. This advantageously makes it possible that the first reflectivity of the reflective element in the first spectral range and the second reflectivity of the reflective element in the second spectral range differ significantly from one another.

The optoelectronic semiconductor chip may be embedded into the wavelength-converting element. Advantageously, the wavelength-converting element may thereby bring about a volume conversion of the wavelength of the electromagnetic radiation emitted by the optoelectronic semiconductor chip. At the same time, the wavelength-converting element brings about protection of the optoelectronic semiconductor chip embedded into the wavelength-converting element against damage resulting from external influences.

The wavelength-converting element may comprise quantum dots. In this case, the quantum dots may be configured to absorb electromagnetic radiation comprising a wavelength from the first spectral range and emit electromagnetic radiation comprising a wavelength from the second spectral range.

The first spectral range may be in the range below 1100 nm. Advantageously, the optoelectronic semiconductor chip may then be configured to emit electromagnetic radiation comprising a wavelength from the near-infrared spectral range.

The second spectral range may be in the range above 1200 nm. The optoelectronic component is thereby suitable to emit electromagnetic radiation from the mid-infrared spectral range.

The above-described properties, features and advantages and the way in which they are achieved will become clearer and more clearly understood in association with the following description of the examples explained in greater detail in association with the drawings.

FIG. 1 shows a schematic sectional side view of a first optoelectronic component 10. The first optoelectronic component 10 is configured to emit electromagnetic radiation, for example, electromagnetic radiation comprising a wavelength from the infrared spectral range. The first optoelectronic component 10 may be configured, for example, as a light-emitting diode component (LED component).

The first optoelectronic component 10 comprises a housing 100 comprising a top side 101 and an underside 102 situated opposite the top side 101. The housing 100 may comprise, for example, a plastics material, for example, an epoxy resin and be produced by a molding process (mold process), for example, by transfer molding or injection molding. The housing 100 may also comprise a ceramic material. The housing 100 may comprise embedded leadframe sections. Other designs of the housing 100 are also possible.

The housing 100 comprises a cavity 110 at its top side 101. The cavity 110 extends from the top side 101 into the housing 100 and is open toward the top side 101 of the housing 100. From a bottom region of the cavity 110 arranged in the interior of the housing 100, the cavity 110 in the example illustrated in FIG. 1 widens toward the top side 101 of the housing 100. However, this is not absolutely necessary.

An optoelectronic semiconductor chip 200 is arranged in the cavity 110 of the housing 100 of the first optoelectronic component 10. The optoelectronic semiconductor chip 200 is secured on the bottom region of the cavity 110 and electrically contacted there. A radiation emission face 210 of the optoelectronic semiconductor chip 200 is oriented in the direction toward the opening of the cavity 110 at the top side 101 of the housing 100.

The optoelectronic semiconductor chip 200 is configured to emit electromagnetic radiation comprising a wavelength from a first spectral range at its radiation emission face 210. The optoelectronic semiconductor chip 200 may be configured, for example, as a light-emitting diode chip (LED chip).

A potting material is arranged in the cavity 110 of the housing 100 of the first optoelectronic component 10, the potting material forming a wavelength-converting element 300. The optoelectronic semiconductor chip 200 is embedded into the potting material and thus also into the wavelength-converting element 300. The potting material may partly or completely fill the cavity 110. In the example shown in FIG. 1, the potting material forming the wavelength-converting element 300 completely fills the cavity 110 of the housing 100 and extends as far as the opening of the cavity 110 at the top side 101 of the housing 100.

The potting material forming the wavelength-converting element 300 comprises a matrix material and wavelength-converting particles embedded into the matrix material. The matrix material may comprise silicone, for example. The wavelength-converting particles embedded into the matrix material may comprise quantum dots, for example.

The wavelength-converting particles of the wavelength-converting element 300 are configured to convert electromagnetic radiation emitted by the optoelectronic semiconductor chip 200 and comprising a wavelength from the first spectral range into electromagnetic radiation comprising a wavelength from a second spectral range. For this purpose, the wavelength-converting particles of the wavelength-converting element 300 are configured to absorb electromagnetic radiation comprising a wavelength from the first spectral range and emit electromagnetic radiation comprising a wavelength from the second spectral range. In this case, the second spectral range has a longer wavelength than the first spectral range.

The wavelength-converting particles of the wavelength-converting element 300 are distributed in the entire potting material forming the wavelength-converting element 300. The wavelength-converting element 300 thus forms a volume-converting wavelength-converting element. Electromagnetic radiation emitted by the optoelectronic semiconductor chip 200 and comprising a wavelength from the first spectral range 610 may be converted into electromagnetic radiation comprising a wavelength from the second spectral range in the entire volume of the wavelength-converting element 300.

A first reflective element 400 is arranged on the radiation emission face 210 of the optoelectronic semiconductor chip 200 of the first optoelectronic component 10. The first reflective element 400 is thus arranged between the optoelectronic semiconductor chip 200 and the wavelength-converting element 300. In the example shown in FIG. 1, the first reflective element 400 is arranged on the optoelectronic semiconductor chip 200 at the radiation emission face 210 of the optoelectronic semiconductor chip 200. However, it is likewise possible to integrate the first reflective element 400 into the optoelectronic semiconductor chip 200 at the radiation emission face 210 of the optoelectronic semiconductor chip 200.

Figure 2:
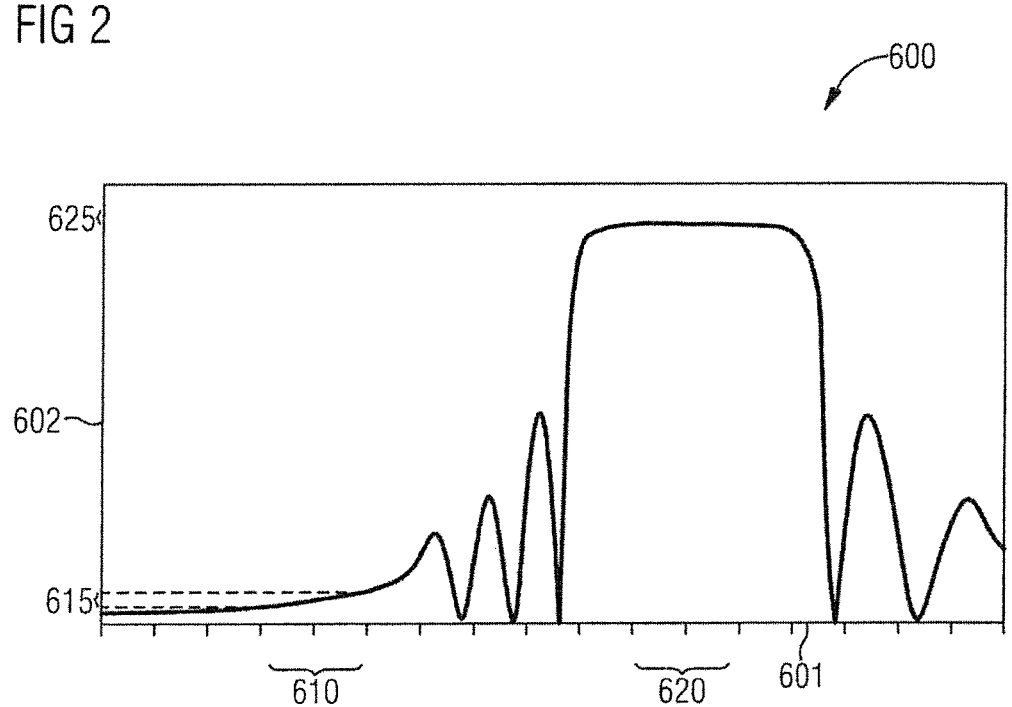
FIG. 2 shows a first schematic reflectivity diagram.

FIG. 2 shows a schematic first reflectivity diagram 600 illustrating wavelength dependence of reflectivity of the first reflective element 400. A wavelength 601 increasing from left to right is plotted on a horizontal axis of the first reflectivity diagram 600. Reflectivity 602 increasing from bottom to top is illustrated on a vertical axis of the first reflectivity diagram 600.

The optoelectronic semiconductor chip 200 is configured to emit electromagnetic radiation comprising a wavelength from a first spectral range 610. The first spectral range 610 may be, for example, below 1100 nm. The wavelength-converting element 300 of the first optoelectronic component 10 is configured to convert electromagnetic radiation comprising a wavelength from the first spectral range 610 into electromagnetic radiation comprising a wavelength from a second spectral range 620. The second spectral range 620 may be, for example, above 1200 nm. The wavelength of the electromagnetic radiation emitted by the optoelectronic semiconductor chip 200, the wavelength being in the first spectral range 610, may also be referred to as pump wavelength. The wavelength of the electromagnetic radiation converted by the wavelength-converting element 300, the wavelength being in the second spectral range 620, may also be referred to as conversion wavelength or as useful wavelength.

The first reflective element 400 comprises a first reflectivity 615 in the first spectral range 610. The first reflective element 400 comprises a second reflectivity 625 in the second spectral range 620. The first reflectivity 615 is less than the second reflectivity 625.

In the example illustrated in FIG. 2, this means that the second reflectivity 625 in the entire second spectral range 620 is greater than the first reflectivity 615 in the entire first spectral range 610, that is to say that the minimum of the second reflectivity 625 in the second spectral range 620 is greater than the maximum of the first reflectivity 615 in the first spectral range 610. It would suffice, however, for the maximum of the second reflectivity 625 of the first reflective element 400 in the second spectral range 620 to be greater than the maximum of the first reflectivity 615 in the first spectral range 610 or for an average value of the second reflectivity 625 in the second spectral range 620 to be greater than an average value of the first reflectivity 615 in the first spectral range 610.

The first reflective element 400 may be configured, for example, as a Bragg mirror (dielectric mirror). In this case, the first reflective element 400 may be formed by layers of materials comprising different refractive indices deposited on the radiation emission face 210 of the optoelectronic semiconductor chip 200, or layers comprising different refractive indices that are integrated into the optoelectronic semiconductor chip 200 at the radiation emission face 210.

Due to the low first reflectivity 615 of the first reflective element 400 for electromagnetic radiation comprising a wavelength from the first spectral range 610, electromagnetic radiation emitted by the optoelectronic semiconductor chip 200 at the radiation emission face 210 and comprising a wavelength from the first spectral range 610 is substantially not reflected at the first reflective element 400, but rather may penetrate through the first reflective element 400 and pass into the wavelength-converting element 300. In contrast, due to the high second reflectivity 625 of the first reflective element 400 for electromagnetic radiation comprising a wavelength from the second spectral range 620, electromagnetic radiation converted by the wavelength-converting element 300 and comprising a wavelength from the second spectral range 620, which electromagnetic radiation is backscattered in the direction toward the radiation emission face 210 of the optoelectronic semiconductor chip 200, is substantially reflected by the first reflective element 400, instead of penetrating through the first reflective element 400, and being absorbed at the radiation emission face 210 of the optoelectronic semiconductor chip 200. Electromagnetic radiation reflected by the first reflective element 400 and comprising a wavelength from the second spectral range 620 may subsequently emerge at the opening of the cavity 110 at the top side 101 of the housing 100 and be emitted by the first optoelectronic component 10. Consequently, by virtue of the first reflective element 400 absorption-dictated losses of the electromagnetic radiation converted by the wavelength-converting element 300 and comprising a wavelength from the second spectral range 620 are reduced.

FIG. 3 shows a schematic sectional side view of a second optoelectronic component 20. The second optoelectronic component 20 largely corresponds to the first optoelectronic component 10 in FIG. 1. Component parts of the second optoelectronic component 20 corresponding to component parts present in the first optoelectronic component 10 are provided with the same reference signs in FIG. 3 as in FIG. 1. Only the differences between the second optoelectronic component 20 and the first optoelectronic component 10 are explained below.

The second optoelectronic component 20 lacks the first reflective element 400 arranged on the radiation emission face 210 of the optoelectronic semiconductor chip 200. Instead, the second optoelectronic component 20 comprises a second reflective element 410. The second reflective element 410 is arranged on a carrier plate 500 that covers the opening of the cavity 110 at the top side 101 of the housing 100. The second reflective element 410 is thereby arranged at the opening of the cavity 110 at the top side 101 of the housing 100 of the second optoelectronic component 20. Consequently, the wavelength-converting element 300 in the second optoelectronic component 20 is situated between the optoelectronic semiconductor chip 200 and the second reflective element 410.

The carrier plate 500 can comprise silicon, for example. In particular, the carrier plate 500 can be configured, for example, as part of a silicon wafer. Besides its function as a carrier of the second reflective element 410, the carrier plate 500 may serve to protect the component parts of the second optoelectronic component 20 arranged in the cavity 110 of the housing 100 against damage resulting from external influences.

FIG. 4 shows a schematic second reflectivity diagram 700 that elucidate reflectivity of the second reflective element 410. Once again the wavelength 601 is plotted on a horizontal axis of the second reflectivity diagram 700. The reflectivity 602 is plotted on a vertical axis of the second reflectivity diagram 700.

The optoelectronic semiconductor chip 200 of the second optoelectronic component 20 is configured to emit electromagnetic radiation comprising a wavelength from a first spectral range 710. The first spectral range 710 may be, for example, below 1100 nm. The wavelength-converting element 300 of the second optoelectronic component 20 is configured to convert electromagnetic radiation emitted by the optoelectronic semiconductor chip 200 and comprising a wavelength from the first spectral range 710 into electromagnetic radiation comprising a wavelength from a second spectral range 720. The second spectral range 720 may be, for example, above 1200 nm.

The second reflective element 410 comprises a first reflectivity 715 for electromagnetic radiation comprising a wavelength from the first spectral range 710. The second reflective element 410 comprises a second reflectivity 725 for electromagnetic radiation comprising a wavelength from the second spectral range 720. The first reflectivity 715 is greater than the second reflectivity 725.

In the example shown in FIG. 4, this means that the first reflectivity 715 of the second reflective element 410 in the entire first spectral range 710 is greater than the second reflectivity 725 in the entire second spectral range 720, that is to say that the minimum of the first reflectivity 715 in the first spectral range 710 is greater than the maximum of the second reflectivity 725 in the second spectral range 720. It would suffice, however, for the maximum of the first reflectivity 715 in the first spectral range 710 to be greater than the maximum of the second reflectivity 725 in the second spectral range 720 or for an average value of the first reflectivity 715 in the first spectral range 710 to be greater than an average value of the second reflectivity 725 in the second spectral range 720.

Electromagnetic radiation emitted by the optoelectronic semiconductor chip 200 of the second optoelectronic component 20 and comprising a wavelength from the first spectral range 710, which electromagnetic radiation passes through the wavelength-converting element 300 of the second optoelectronic component 20 without being converted into electromagnetic radiation comprising a wavelength from the second spectral range 720 and passes to the second reflective element 410, due to the high first reflectivity 715 of the second reflective element 410, is reflected with high probability back into the wavelength-converting element 300, where it obtains a further opportunity to be converted into electromagnetic radiation comprising a wavelength from the second spectral range 720 by the wavelength-converting element 300. In contrast, electromagnetic radiation converted by the wavelength-converting element 300 and comprising a wavelength from the second spectral range 720, which electromagnetic radiation passes to the second reflective element 410 at the opening of the cavity 110 at the top side 101 of the housing 100 of the second optoelectronic component 20, may penetrate with high probability through the second reflective element 410 due to the low second reflectivity 725 of the second reflective element 410, then also penetrates through the carrier plate 500 carrying the second reflective element 410 and is subsequently emitted by the second optoelectronic component 20.

As a result of the reflection of electromagnetic radiation comprising a wavelength from the first spectral range 710 at the second reflective element 410, the proportion of electromagnetic radiation comprising a wavelength from the first spectral range 710 in the electromagnetic radiation emitted toward the outside by the second optoelectronic component 20 decreases, while the proportion of electromagnetic radiation comprising a wavelength from the second spectral range 720 increases.

The carrier plate 500 may be configured to absorb electromagnetic radiation comprising a wavelength from the first spectral range 710 that has penetrated through the second reflective element 410 without reflection despite the high first reflectivity 715. The proportion of electromagnetic radiation comprising a wavelength from the first spectral range 710 in the electromagnetic radiation emitted toward the outside by the second optoelectronic component 20 is reduced further as a result. If the first spectral range 710 is below 1100 nm, the carrier plate 500 may comprise silicon, for example, in this case.

The second reflective element 410 may be configured as a Bragg mirror, for example.

FIG. 5 shows a schematic sectional side view of a third optoelectronic component 30. The third optoelectronic component 30 largely corresponds to the second optoelectronic component 20 in FIG. 3. Component parts of the third optoelectronic component 30 corresponding to component parts present in the second optoelectronic component 20 are provided with the same reference signs in FIG. 5 as in FIG. 3. Only the differences between the third optoelectronic component 30 and the second optoelectronic component 20 are described below.

The third optoelectronic component 30 lacks the carrier plate 500. Instead, the second reflective element 410 of the third optoelectronic component 30 is arranged on a top side 310 of the wavelength-converting element 300, which is arranged in the cavity 110 of the housing 100, at the opening of the cavity 110 at the top side 101 of the housing 100. The second reflective element 410 may, for example, be configured as a Bragg mirror and arranged on the top side 310 of the wavelength-converting element 300 by plasma-enhanced chemical vapor deposition.

The reflection properties of the second reflective element 410 of the third optoelectronic component 30 correspond to the reflection properties of the second reflective element 410 of the second optoelectronic component 20.

FIG. 6 shows a schematic sectional side view of a fourth optoelectronic component 40. The fourth optoelectronic component 40 largely corresponds to the first optoelectronic component 10 in FIG. 1 and to the second optoelectronic component 20 in FIG. 3. Component parts of the fourth optoelectronic component 40 which are also present in the first optoelectronic component 10 and/or in the second optoelectronic component 20 are provided with the same reference signs in FIG. 6 as in FIGS. 1 and 3. Only the differences between the fourth optoelectronic component 40 and the first optoelectronic component 10 or the second optoelectronic component 20 are explained below.

The fourth optoelectronic component 40 comprises, like the first optoelectronic component 10, the first reflective element 400 arranged on the radiation emission face 210 of the optoelectronic semiconductor chip 200. The reflection properties of the first reflective element 400 of the fourth optoelectronic component 40 correspond to the reflection properties (explained with reference to FIG. 2) of the first reflective element 400 of the first optoelectronic component 10.

In addition, the fourth optoelectronic component 40 comprises, like the second optoelectronic component 20, the carrier plate 500 with the second reflective element 410 arranged thereon. The reflection properties of the second reflective element 410 of the fourth optoelectronic component 40 correspond to the reflection properties (explained with reference to FIG. 4) of the second reflective element 410 of the second optoelectronic component 20.

In the fourth optoelectronic component 40, the second reflective element 410, instead of being arranged on the carrier plate 500, could be arranged on the top side 310 of the wavelength-converting element 300, as is the case for the third optoelectronic component 30 in FIG. 5.

Our components have been illustrated and described in greater detail on the basis of preferred examples. Nevertheless, this disclosure is not restricted to the examples disclosed. Rather, other variations may be derived therefrom by one skilled in the art, without departing from the scope of protection of the appended claims.

This application claims priority of DE 10 2015 104 237.1, the subject matter of which is incorporated herein by reference.

The invention claimed is:

1. An optoelectronic component comprising:
an optoelectronic semiconductor chip configured to emit electromagnetic radiation comprising a wavelength from a first spectral range,
a wavelength-converting element configured to convert electromagnetic radiation comprising a wavelength from the first spectral range into electromagnetic radiation comprising a wavelength from a second spectral range, and
a reflective element comprising a first reflectivity in the first spectral range and a second reflectivity in the second spectral range,
wherein the first spectral range is below 1100 nm, and the second spectral range is above 1200 nm.

2. The optoelectronic component according to claim 1, wherein the reflective element is arranged between the optoelectronic semiconductor chip and the wavelength-converting element, and
the first reflectivity is less than the second reflectivity.

3. The optoelectronic component according to claim 2, wherein the reflective element is arranged on a radiation emission face of the optoelectronic semiconductor chip.

4. The optoelectronic component according to claim 1, wherein the wavelength-converting element is arranged between the optoelectronic semiconductor chip and the reflective element, and
the first reflectivity is greater than the second reflectivity.

5. The optoelectronic component according to claim 4, wherein the reflective element is arranged on a carrier plate.

6. The optoelectronic component according to claim 5, wherein the carrier plate comprises silicon.

7. The optoelectronic component according to claim 4, wherein the reflective element is applied on a top side of the wavelength-converting element.

8. The optoelectronic component according to claim 4, wherein the optoelectronic component comprises a further reflective element, arranged between the optoelectronic semiconductor chip and the wavelength-converting element, and
the further reflective element comprises a lower reflectivity in the first spectral range than in the second spectral range.

9. The optoelectronic component according to claim 1, wherein the reflective element is configured as a Bragg mirror.

10. The optoelectronic component according to claim 1, wherein the optoelectronic semiconductor chip is embedded into the wavelength-converting element.

11. The optoelectronic component according to claim 1, wherein the wavelength-converting element comprises quantum dots.

* * * * *